(12) United States Patent
Tsou

(10) Patent No.: US 10,835,035 B1
(45) Date of Patent: Nov. 17, 2020

(54) ACCOMMODATION CABINET WITH HANDTOOLLESSLY ASSEMBLED FRAME BODY

(71) Applicant: CHEN-SOURCE INC., Taoyuan (TW)

(72) Inventor: Wen-Sheng Tsou, Taoyuan (TW)

(73) Assignee: CHEN-SOURCE INC., Taoyuan (TW)

( * ) Notice: Subject to any disclaimer, the term of this patent is extended or adjusted under 35 U.S.C. 154(b) by 0 days.

(21) Appl. No.: 16/566,088

(22) Filed: Sep. 10, 2019

(51) Int. Cl.
*A47B 47/00* (2006.01)
*H05K 5/02* (2006.01)

(52) U.S. Cl.
CPC .......... *A47B 47/00* (2013.01); *H05K 5/0217* (2013.01)

(58) Field of Classification Search
CPC ............................. A47B 47/00; H05K 5/0217
See application file for complete search history.

(56) References Cited

U.S. PATENT DOCUMENTS

| | | | | |
|---|---|---|---|---|
| 3,133,768 A * | 5/1964 | Klakovich | ............. | A47B 88/49 384/17 |
| 4,217,012 A * | 8/1980 | Klaus | ..................... | A47B 55/06 312/111 |
| 4,993,847 A * | 2/1991 | Hobbs | ..................... | A47B 88/57 312/334.46 |
| 5,246,284 A * | 9/1993 | Merzon | .................. | A47B 67/04 312/107 |
| 5,577,779 A * | 11/1996 | Dangel | ................... | E05C 19/06 220/326 |
| 5,665,304 A * | 9/1997 | Heinen | .................... | A47F 1/126 108/110 |
| 5,941,617 A * | 8/1999 | Crane, Jr. | ................. | B44C 5/04 312/204 |
| 5,980,003 A * | 11/1999 | Huang | ................. | G11B 33/124 312/223.2 |
| 5,995,363 A * | 11/1999 | Wu | ....................... | H05K 5/0256 312/223.1 |
| 6,054,650 A * | 4/2000 | Schindler | ............. | H05K 9/0016 174/50 |
| 6,354,680 B1 * | 3/2002 | Lin | ......................... | G06F 1/181 292/87 |
| 6,375,283 B1 * | 4/2002 | Kitamura | ............. | H04B 1/3833 292/81 |
| 6,457,788 B1 * | 10/2002 | Perez | ...................... | G06F 1/181 297/80 |
| 6,924,975 B2 * | 8/2005 | Lai | .......................... | G06F 1/181 24/453 |

(Continued)

*Primary Examiner* — Hanh V Tran
(74) *Attorney, Agent, or Firm* — Muncy, Geissler, Olds & Lowe, P.C.

(57) ABSTRACT

An accommodation cabinet with a handtoollessly assembled frame body is disclosed. The accommodation cabinet includes a cabinet body and the frame body. The cabinet body includes a spring clip disposed on a side thereof, and a button protruded on a surface of the spring clip, and a fastening part disposed on the spring clip and around the button. The frame body is mounted on a side of the cabinet body, and the frame body includes a groove configured for insertion of the button, and an engaging part for combining with the fastening part. When a user wants to change the frame body of the cabinet body, the user can press the button to elastically deform the spring clip, so as to disengage the fastening part from the engaging part, and then take out the frame body and assemble different color of other frame body with the cabinet body.

2 Claims, 5 Drawing Sheets

(56) References Cited

U.S. PATENT DOCUMENTS

| | | | | |
|---|---|---|---|---|
| 7,277,277 | B2* | 10/2007 | Bang | G06F 1/181 |
| | | | | 312/223.1 |
| 7,448,702 | B2* | 11/2008 | Chen | G06F 1/181 |
| | | | | 292/150 |
| 7,486,506 | B2* | 2/2009 | Chen | G06F 1/181 |
| | | | | 312/223.2 |
| 8,215,727 | B2* | 7/2012 | Barrall | G06F 1/187 |
| | | | | 312/223.2 |
| 8,226,178 | B2* | 7/2012 | Kummel | F25D 23/126 |
| | | | | 312/204 |
| 8,480,186 | B2* | 7/2013 | Wang | H05K 5/0013 |
| | | | | 312/223.1 |
| 8,827,323 | B2* | 9/2014 | Jiang | G06F 1/181 |
| | | | | 292/137 |
| 10,154,605 | B1* | 12/2018 | Hartman | H05K 5/0217 |
| 2004/0017136 | A1* | 1/2004 | Liu | G06F 1/1613 |
| | | | | 312/204 |
| 2007/0097330 | A1* | 5/2007 | Park | G02F 1/133308 |
| | | | | 353/79 |
| 2014/0254192 | A1* | 9/2014 | Do | G02F 1/133308 |
| | | | | 362/606 |
| 2015/0208523 | A1* | 7/2015 | Lee | H05K 5/03 |
| | | | | 361/679.01 |
| 2015/0336411 | A1* | 11/2015 | Faber | B41K 1/36 |
| | | | | 101/327 |
| 2019/0075664 | A1* | 3/2019 | Sisson | G06F 1/1656 |
| 2019/0141818 | A1* | 5/2019 | Pearson | H05K 5/0217 |

* cited by examiner

ACCOMMODATION CABINET WITH HANDTOOLLESSLY ASSEMBLED FRAME BODY

BACKGROUND OF THE INVENTION

1. Field of the Invention

The present invention relates to an accommodation cabinet with a handtoollessly assembled frame body, more particularly to an accommodation cabinet in which a button of a cabinet body can be pressed to outwardly take a frame body out, to further assemble different color of other frame body, so as to fast change the frame body of the accommodation cabinet without using hand tools and to improve beautiful performance and identification of the accommodation cabinet by designing color of the frame body, thereby making the accommodation cabinet competitive.

2. Description of the Related Art

In recent years, with rapid development of electronic technology and multimedia information, electronic products such as smart phones, tablet computers, and notebook computers are designed toward light, short, and powerful functions to have features of smaller size, lighter weight, and easy carry, and software and hardware of the electronic products are also continuously innovated, so that the electronic products can be used more flexibly and have improved practical effects, and become indispensable devices widely applied in people's work and life entertainment.

However, as the processing speed of the electronic product is improved, the mobile electronic device such as smart phone, tablet computer or notebook computer consumes more power. As a result, when a user operates a mobile electronic product while walking, the battery power of the mobile electronic device is quickly exhausted, and the user needs to find a power socket to charge the battery of the mobile electronic device.

Particularly, in teaching environment (for example, schools), in order to meet the requirement in digital teaching, teachers and students use mobile electronic devices, such as tablets or notebooks, to replace traditional books for knowledge transfer, so how to conveniently charge the mobile electronics becomes extremely important. Generally, a charging device, such as a charging cabinet or a charging car, can provide a plurality of AC sockets or DC charging sockets, such as USB sockets disposed thereon, to charge the plurality of mobile electronic devices through necessary chargers and charging lines.

The conventional charging cabinets of the same types have uniform appearances when they are shipped from the factory, so it is hard for users to change the styles of the conventional charging cabinets according to their own preferences. For these reason, the use of the conventional charging cabinet is not interesting and quite boring. Furthermore, because the styles of the conventional charging cabinets are the same, it is not easily to identify these charging cabinets, and when multiple charging cabinets are used together, it is difficult for a user to identify which charging cabinet where the mobile electronic device is placed, and it causes inconvenience in use.

Therefore, what is need is to develop an accommodation cabinet with handtoollessly assembled frame body, to solve the aforementioned conventional problems.

SUMMARY OF THE INVENTION

In order to solve the aforementioned problems, the inventors develop an accommodation cabinet with handtoollessly assembled frame body according to collected data, multiple tests and modifications, and years of experience in the industry.

An objective of the present invention is that a cabinet body of an accommodation cabinet includes at least one spring clip disposed on at least one lateral side thereof, a button protruded on a surface of the spring clip, and at least one fastening part disposed on the surface of the spring clip and around the button, and a frame body of the accommodation cabinet is mounted on a side of the cabinet body and includes at least one groove formed on at least one lateral side thereof and configured for insertion of the button, and at least one engaging part disposed around the groove and configured to combine and locate with the at least one fastening part, and when a user wants to change the color of the frame body of the cabinet body, the user can press the button of the cabinet body first, to make the spring clip of the cabinet body deform elastically, so as to disengage the at least one fastening part from the at least one engaging part, and the user can then outwardly take the frame body out, and then assemble other frame body having different color with the cabinet body. As a result, the frame body of the accommodation cabinet of the present invention can be changed fast without using hand tools, so as to increase beautiful performance and identification of the accommodation cabinet by designing color of the frame body, thereby achieving the purpose of making the accommodation cabinet more competitive.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
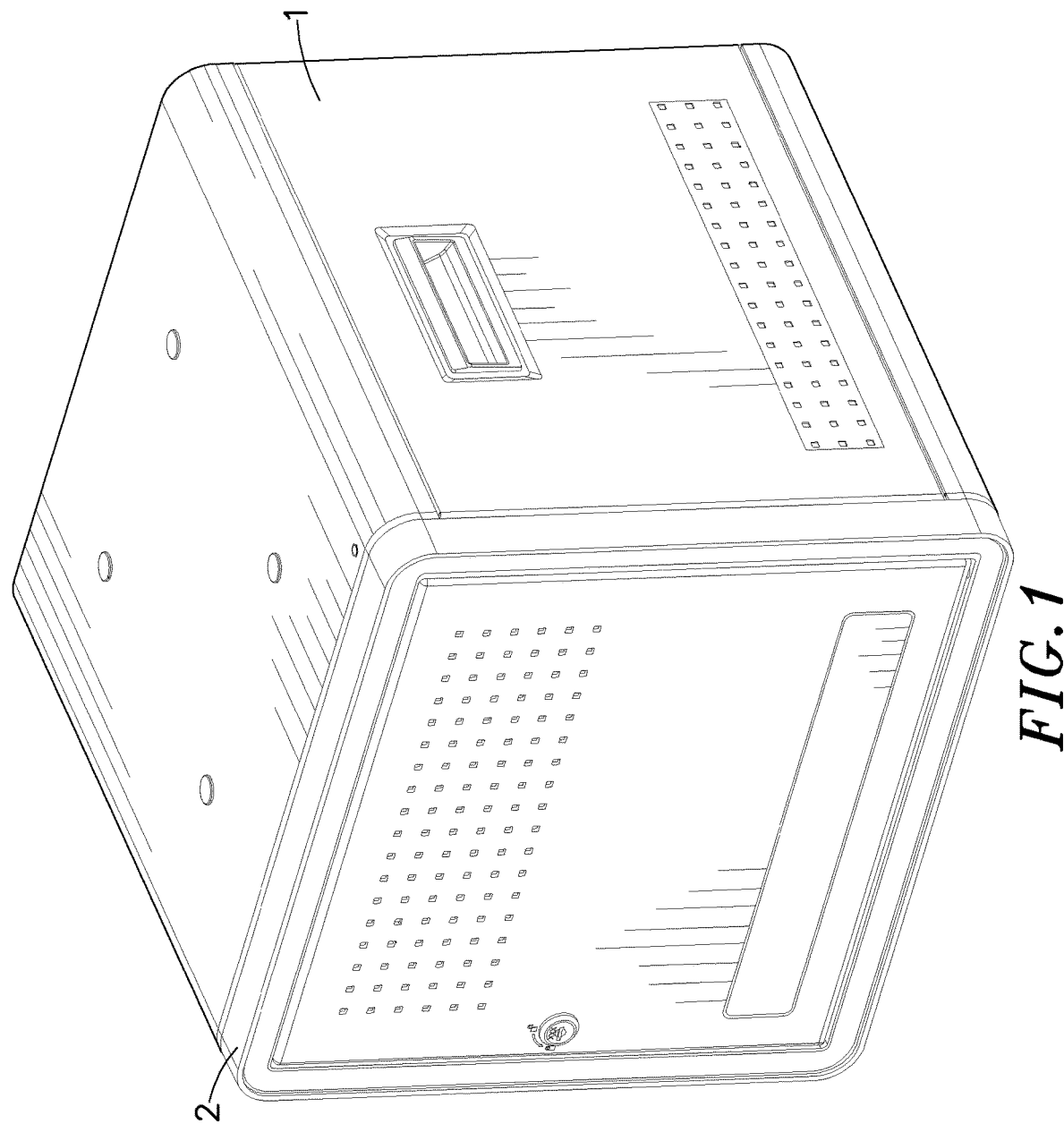
FIG. 1 is a perspective view of an accommodation cabinet of the present invention.
Figure 2:
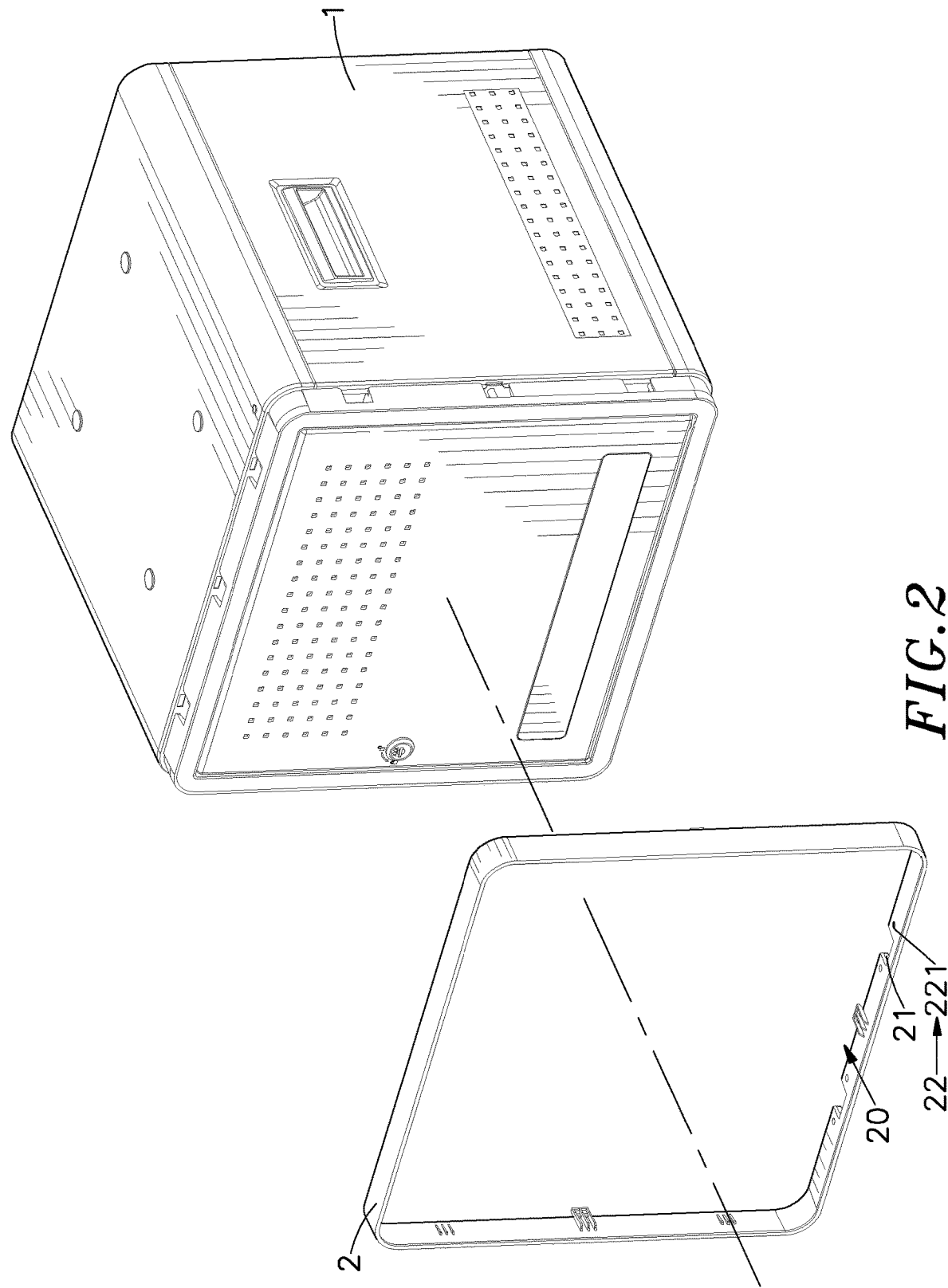
FIG. 2 is a perspective exploded view of an accommodation cabinet of the present invention.
Figure 3:
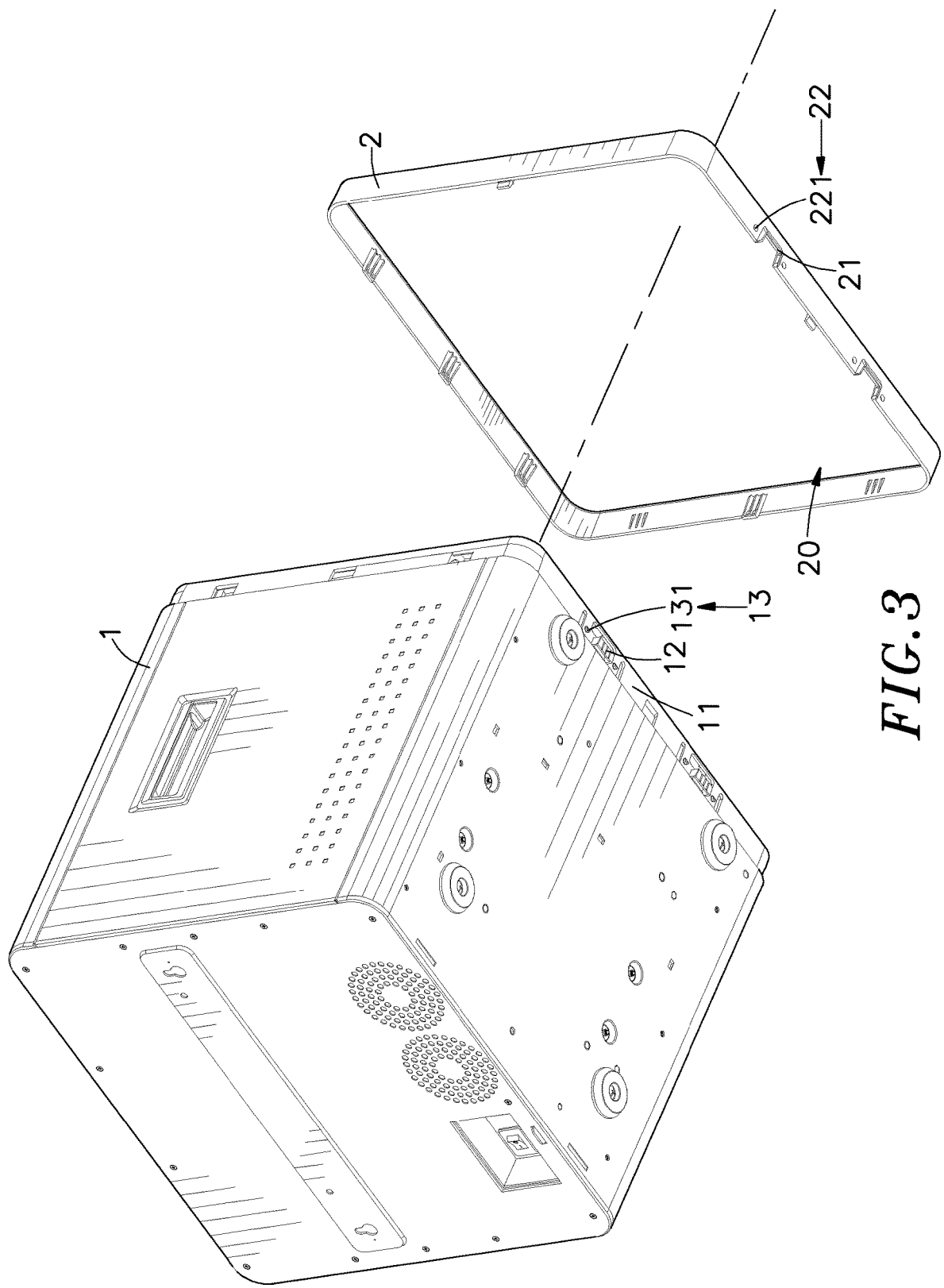
FIG. 3 is a perspective exploded view of an accommodation cabinet of the present invention, when viewed from another angle.
Figure 4:
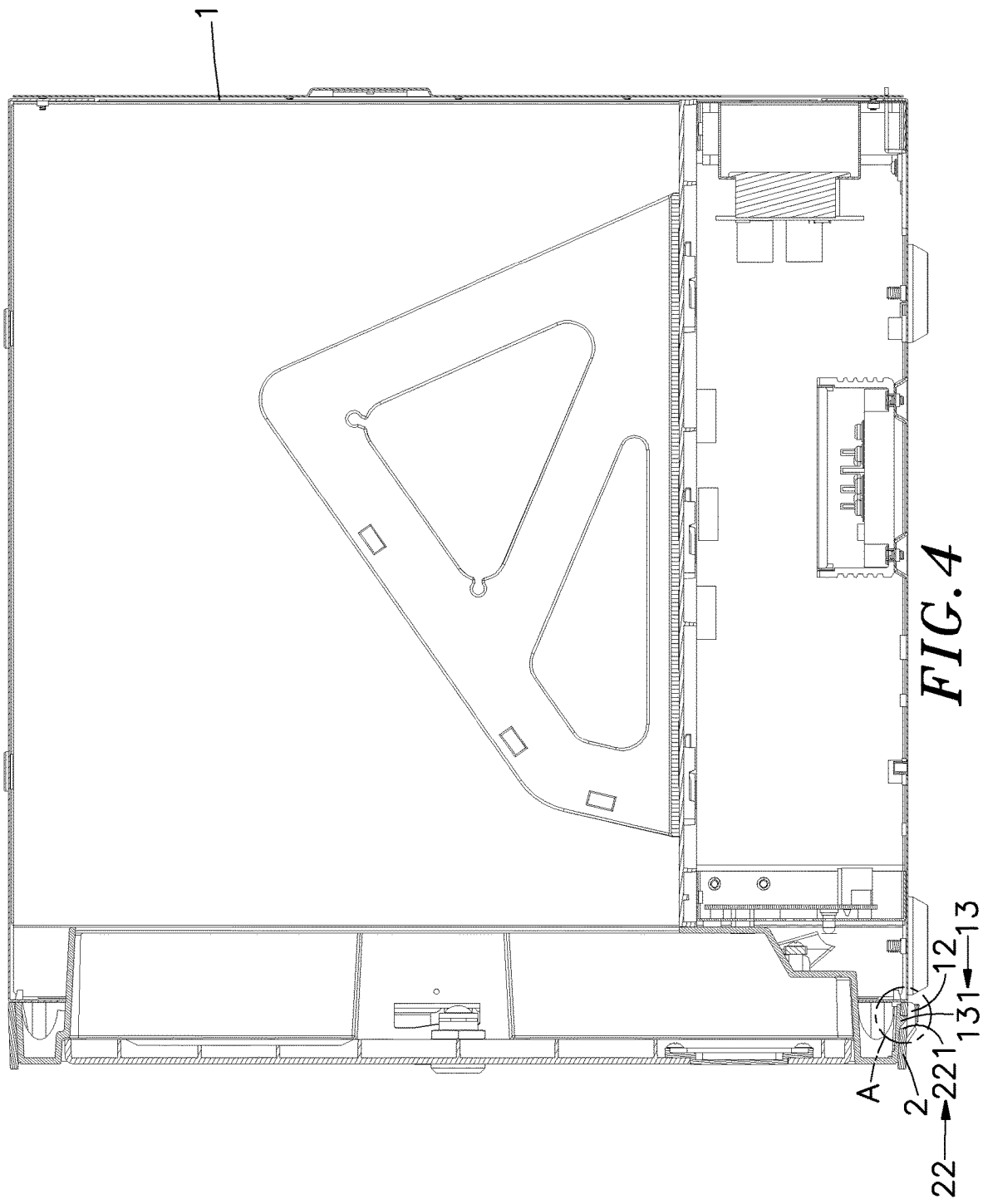
FIG. 4 is a sectional side view of an accommodation cabinet of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

Figure 5:
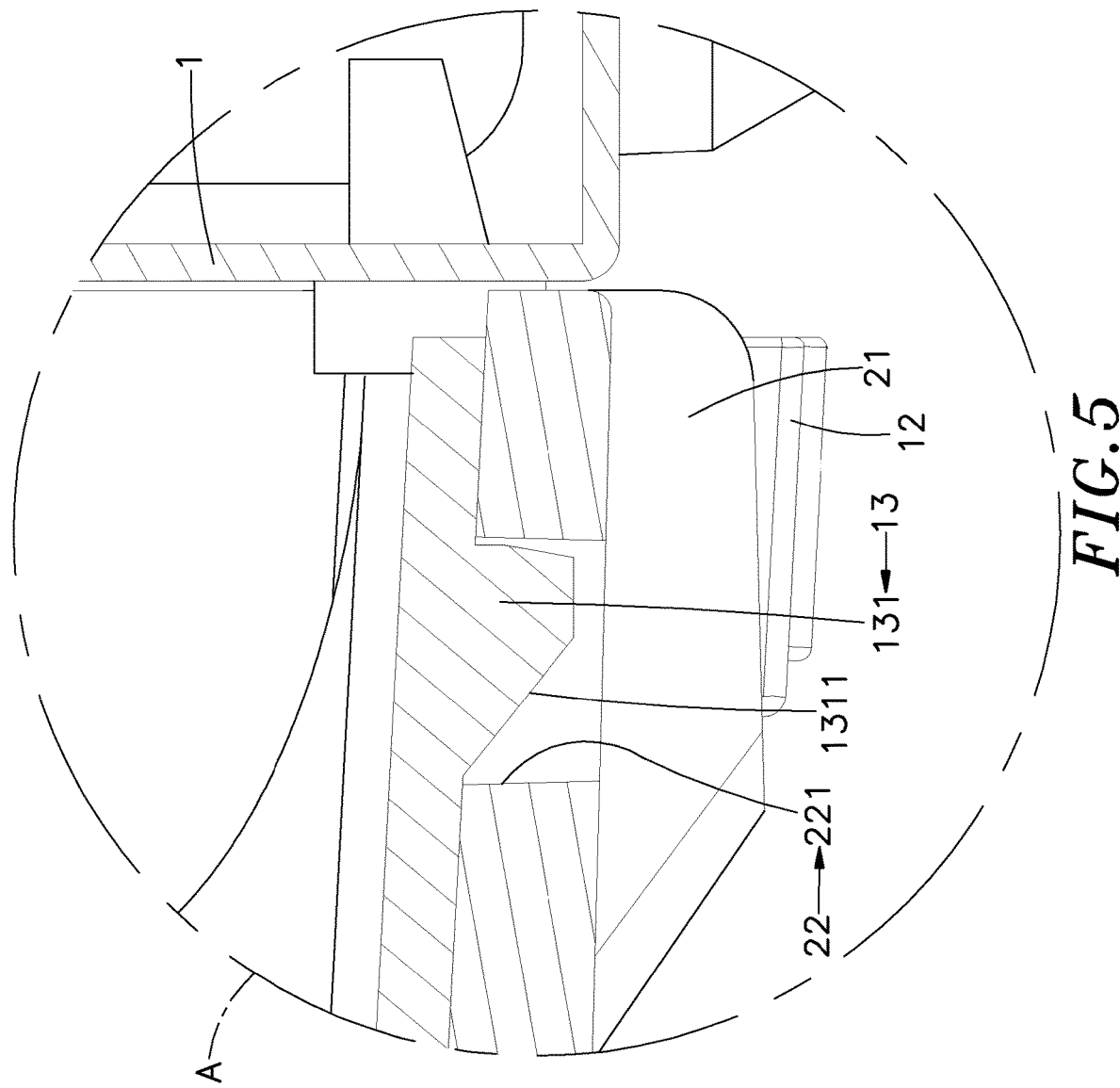
FIG. 5 is an enlarged view of an "A" part of FIG. 4 according to the present invention.

Please refer to FIGS. 1 to 5. FIGS. 1 to 4 are a perspective view, two perspective exploded views, a sectional side view of an accommodation cabinet of the present invention, respectively, and FIG. 5 is an enlarged view of a "A" part of FIG. 4. The accommodation cabinet of the present invention includes a cabinet body 1 and a frame body 2.

The cabinet body 1 comprises at least one spring clip 11 disposed on at least one lateral side thereof, and a button 12 protruded on a surface of the at least one spring clip 11, and at least one fastening part 13 disposed on the surface of the at least one spring clip 11 and around the button 12. The fastening part 13 comprises a fastening body 131 outwardly extended, and the fastening body 131 has a guiding incline 1311 formed on a front part thereof.

The frame body 2 comprises a mounting space 20 formed in the inside thereof, at least one groove 21 formed on at least one lateral side thereof, and at least one engaging part 22 disposed around the at least one groove 21. The engaging part 22 has a hole 221 longitudinally cut therethrough.

In an embodiment, the cabinet body 1 can be a charging cabinet; however, in an actual application, the cabinet body 1 can be a storage cabinet, a red wine shelf or other cabinet body 1 for accommodating articles.

Furthermore, the color of the frame body 2 can be red, orange, yellow, green, blue, indigo, purple, or other color.

In order to assemble the accommodation cabinet of the present invention, the frame body 2 can be mounted towards the cabinet body 1, to make the lateral side of the frame body 2 push the guiding incline 1311 of the fastening body 131 of the at least one fastening part 13, so that the spring clip 11 is pressed to elastically deform and the fastening body 131 of the at least one fastening part 13 is moved along an inner wall of the mounting space 20 of the frame body 2 until the fastening body 131 of the at least one fastening part 13 is aligned to the hole 221 of the at least one engaging part 22 of the frame body 2 and the spring clip 11 elastically recovers; as a result, the fastening body 131 of the at least one fastening part 13 can be inserted into and located in the hole 221 of the at least one engaging part 22, and the button 12 of the cabinet body 1 can be located in the groove 21 of the frame body 2, and the frame body 2 can be mounted on the cabinet body 1, so that the cabinet body 1 can be stably located in the mounting space 20 of the frame body 2, and the assembly operation of the accommodation cabinet of the present invention is completed.

Preferably, the at least one fastening part 13 of the cabinet body 1 can be located in the hole 221 of the at least one engaging part 22 by inserting the fastening body 131 in to the hole 221; however, in an actual application, the fastening part 13 can be a hole, and the engaging part 22 can be a fastening body to be inserted in the hole; or the fastening part 13 and the engaging part 22 can be convex buckles, grooves, or other type of engaging assemblies which can be engaged with each other, and can be used to removably assemble the frame body 2 on the cabinet body 1. It should be noted that there are many ways to combine the at least one fastening part 13 of the cabinet body 1 with the at least one engaging part 22 of the frame body 2, and various equivalent structural changes, alternations or modifications based on the descriptions and figures of present invention are all consequently viewed as being embraced by the spirit and the scope of the present invention set forth in the claims.

When the user wants to change the color of the frame body 2 of the cabinet body 1, the user can first press to the button 12 of the cabinet body 1, to elastically deform the spring clip 11 of the cabinet body 1 to disengage the fastening body 131 of the at least one fastening part 13 from the hole 221 of the at least one engaging part 22, so that the user can outwardly take the frame body 2 out, and use different color of other frame body 2 for aforementioned assembly operation. As a result, the cabinet body 1 of the present invention can be changed to assemble with different color of the frame body 2, so as to achieve the effect of quickly changing the frame body 2 without using hand tools, and increase beautiful performance and identification of the accommodation cabinet by designing the color of the frame body 2, thereby making the accommodation cabinet competitive.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. An accommodation cabinet with a handtoollessly assembled frame body, and the accommodation cabinet comprising:
   a cabinet body comprising at least one spring clip disposed on at least one lateral side thereof, at least one button protruded outwardly on an outer surface of the at least one spring clip, and at least one fastening part disposed on the surface of the at least one spring clip and around the at least one button, the at least one fastening part comprises a fastening body extended outwardly, a guiding incline formed on a side of the fastening part; and
   the frame body comprising a mounting space formed in the inside thereof and configured to mount with the cabinet body, and at least one groove formed on at least one lateral side thereof and configured for insertion of the at least one button, and at least one engaging part disposed around the at least one groove, and the engaging part comprises a hole longitudinally cut therethrough, the frame body mounted towards the cabinet body, to make the lateral side of the frame body push the guiding incline of the fastening body, so that the spring clip is pressed to elastically deform, after the fastening body is aligned to the hole and the spring clip elastically recovers, the fastening body inserted into and located in the hole; and when the at least one button of the cabinet body is pressed, the spring clip is elastically deformed and the fastening body of the fastening part is disengaged from the hole of the engaging part of the frame body, for assemble or disassemble the frame body.

2. The accommodation cabinet according to claim 1, wherein a color of the frame body is red, orange, yellow, green, blue, indigo or purple.

\* \* \* \* \*